United States Patent [19]

Munoz

[11] 4,337,435

[45] Jun. 29, 1982

[54] DIGITAL PHASE SEQUENCE DETECTOR

[75] Inventor: Joseph P. Munoz, Miami, Fla.

[73] Assignee: Westinghouse Electric Corp., Pittsburgh, Pa.

[21] Appl. No.: 158,105

[22] Filed: Jun. 10, 1980

[51] Int. Cl.³ .............................................. H03K 5/26
[52] U.S. Cl. .................................... 328/133; 307/514
[58] Field of Search ................ 328/133, 134; 307/514, 307/516

[56] References Cited

U.S. PATENT DOCUMENTS

| | | | |
|---|---|---|---|
| 3,430,148 | 2/1969 | Miki | 328/133 |
| 3,588,710 | 6/1971 | Masters | 328/133 |
| 3,755,747 | 8/1973 | Letusky | 328/133 |
| 3,857,103 | 12/1974 | Grazia | 307/514 |
| 3,986,128 | 10/1976 | Eriksson et al. | 307/133 |

Primary Examiner—John S. Heyman
Attorney, Agent, or Firm—D. R. Lackey

[57] ABSTRACT

A digital phase sequence detector which operates completely independent of signal amplitude values to provide an output signal having a logic level indicative of which of two phasors being compared is leading. The detector develops first and second feedback signals which determine the stable state of the circuit. This feedback arrangement enables the detector to be constructed of standard integrated circuits devoid of flip-flops or other memory elements requiring a clock. The level of the output signal of the detector persists for as long as the relationship being indicated persists, eliminating the need for pulse stretchers, timers, or the like.

4 Claims, 4 Drawing Figures

DIGITAL PHASE SEQUENCE DETECTOR

BACKGROUND OF THE INVENTION

1. Field of the Invention:

The invention relates in general to phase sequence detectors, and more specifically to digital phase sequence detectors which operate independently of signal magnitudes.

2. Description of the Prior Art:

Certain prior art phase sequence detector arrangements utilize a large plurality of discrete components interconnected according to the dictates of special circuitry. The discrete components, such as transistors, resistors, Zener diodes, conventional diodes, controlled rectifiers, and capacitors require considerable printed circuit board space, and also labor to manufacture them. This circuitry is also signal magnitude dependent because of the Zener diodes, and pulse stretchers are required to hold the output signal for a predetermined period of time.

It would be desirable to provide a new and improved phase sequence detector which is completely digital, with no dependence upon magnitude values, which may be manufactured from standard i.c. logic packages, which does not require flip-flops or other memory elements which require a clock for input signal synchronization, which does not require pulse stretchers and which is not time dependent.

SUMMARY OF THE INVENTION

Briefly, the present invention is a new and improved phase sequence detector which is completely digital, eliminating dependence upon signal magnitude values. Th new and improved digital phase sequence detector provides an output signal having a logic level indicative of which the two phasors being compared is leading, and the output persists without pulse stretchers, timers, or the like, as long as the relationship indicated persists.

The new and improved phase sequence detector does not require special circuits, utilizing standard logic gates which are available as standard i.c.'s, greatly reducing the printed circuit board area required, and the labor for manufacturing the boards. The detector utilizes asynchronous sequential logic without resorting to flip-flops or other memory elements which require a clock for synchronizing inputs, often used with such circuits.

BRIEF DESCRIPTION OF THE DRAWING

The invention may be better understood, and further advantages and uses thereof more readily apparent, when considered in view of the following detailed description of exemplary embodiments, taken with the accompanying drawings, in which.

DESCRIPTION OF THE PREFERRED EMBODIMENT

Certain types of apparatus require the phase sequence between two phasors to be compared or detected, with the comparator or detector providing a signal when the lead-lag relationship between them changes. An example of such apparatus is a protective relay for monitoring electrical power transmission lines of the type which provides a polarizing signal and an operate signal. In the absence of a fault in the protected zone of the delay, the polarizing signal leads the operate signal. If the operate signal should lead the polarizing signal, indicating a fault in the protective zone, this fact should be immediately noted and a signal generated which will trip the requisite circuit breakers to isolate the fault.

Figure 1:
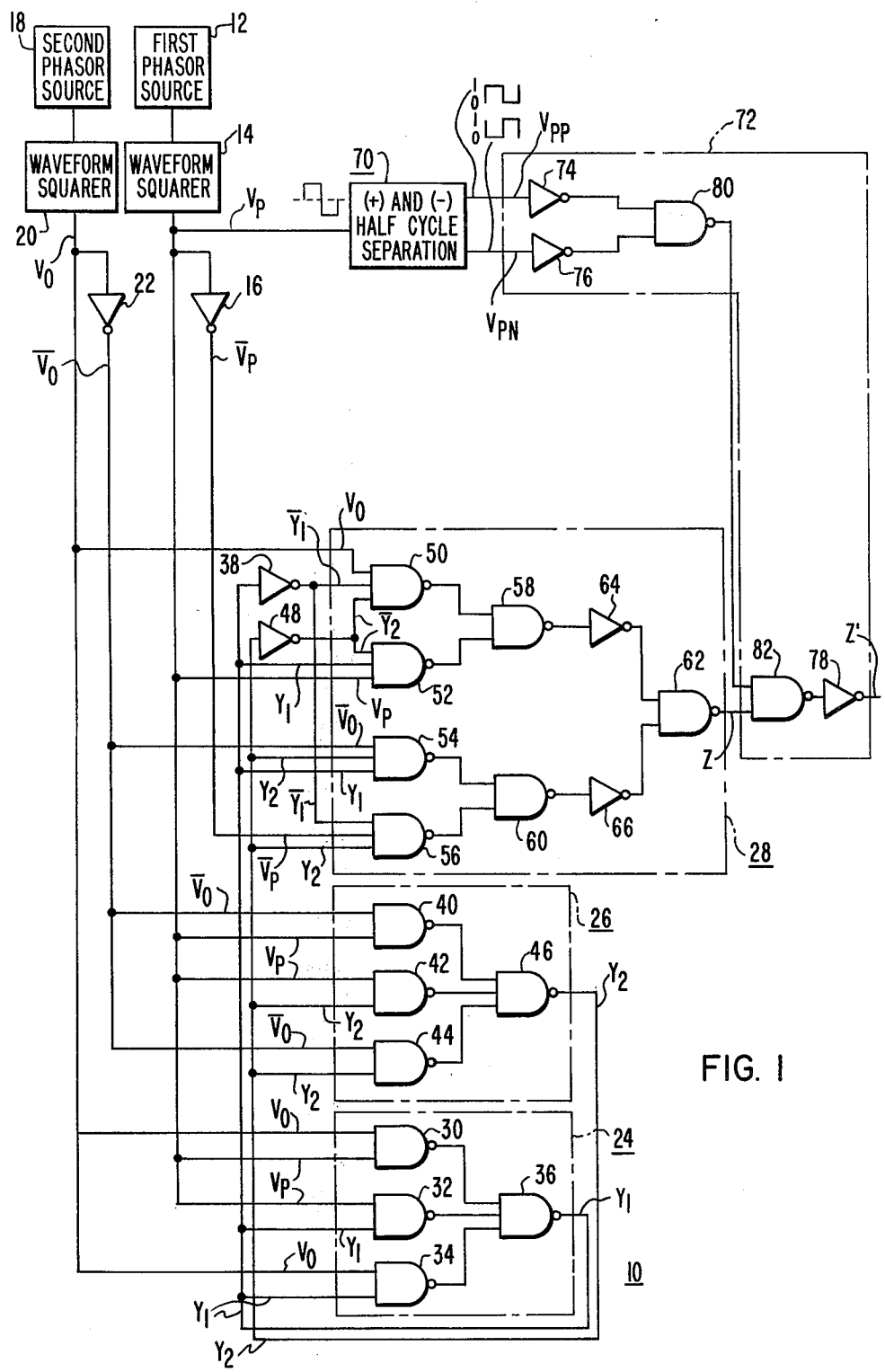
FIG. 1 is a schematic diagram of a digital phase sequence detector constructed according to the teachings of the invention.

FIG. 1 is a schematic diagram of a digital phase sequence detector 10 constructed according to the teachings of the invention, which is suitable for comparing the polarizing and operate phasors in a protective relay system, or for any other application which must monitor and detect the phase relationship between two phasors.

The first phasor source is indicated generally at 12, with its sinusoidal waveform being squared in a suitable waveform squaring circuit 14. Circuit 14 may utilize operational amplifiers in an arrangement well known in the art. The squared waveform at the output of the waveform squarer 14 is referenced $V_P$, as it will be assumed that it represents the polarizing signal in the protective relay application of the comparator 10. An inverter or NOT gate 16 provides the complement $\overline{V}_P$.

In like manner, the second phasor source is indicated generally at 18, with the sinusoidal waveform of the second phasor being squared in a waveform squarer 20. The output of waveform squarer 20 is referenced $V_O$, to indicate the "operate" signal in the protective relay application, and a NOT gate 22 provides the complement $\overline{V}_O$.

Figure 2:
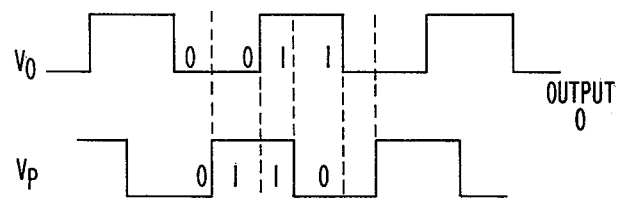
FIG. 2 is a graph which illustrates the binary sequence between two compared signals which results in the detector shown in FIG. 1 providing a predetermined logic level at its output.
Figure 3:
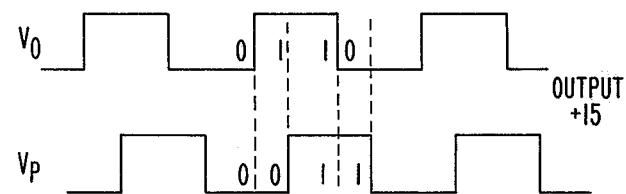
FIG. 3 is a graph similar to that shown in FIG. 2 except illustrating a different lead-lag relationship between the compared signals, and thus a different binary sequence than the relationship shown in FIG. 2, resulting in the detector shown in FIG. 1 providing a different logic level output than for the FIG. 2 sequence.

FIGS. 2 and 3 are graphs which illustrate the two different phase relationships which may exist between signals $V_O$ and $V_P$. In FIG. 2, the polarizing signal $V_P$ leads the operate signal $V_O$, providing the binary sequence 00-01-11-10 between the compared signals. Since this is the normal or no-fault sequence, the comparator 10 should have a logic zero output in response to this binary sequence.

In FIG. 3, the operate signal $V_O$ leads the polarizing signal $V_P$, providing the binary sequence 00-10-11-01 between the compared signals. This is the "fault" sequence and the output of detector 10 should switch to a logic one when the sequence changes from that shown in FIG. 2 to that shown in FIG. 3.

The circuitry for responding properly to the two different binary sequences shown in FIGS. 2 and 3 is shown in FIG. 1, and it includes first, second and third logic circuits 24, 26 and 28, respectively. It will be noted that these logic circuits are constructed entirely of standard logic gates, which are available as standard integrated circuits. The first and second logic circuits 24 and 26 are feedback circuits which demonstrate the stable state of comparator 10.

More specifically, logic circuit 24 includes first, second and third dual input NAND gates 30, 32 and 34, respectively, and a three-input NAND gate 36. The outputs of the dual input NAND gates 30, 32 and 34 provide the three inputs to NAND gate 36, and the output of NAND gate 36 provides a first feedback signal $Y_1$. A NOT gate 38 provides the complement $\overline{Y}_1$. Signals $V_O$ and $V_P$ provide the inputs to NAND gate 30, signals $V_P$ and $Y_1$ provide the input to NAND gate 32, and signals $V_O$ and $Y_1$ provide the inputs to NAND gate 34. Thus, the first feedback signal $Y_1$ is determined by the logic equation:

$$Y_1 = \overline{(\overline{V_O V_P})(\overline{V_P Y_1})(\overline{V_O Y_1})}$$

Logic circuit 26 includes first, second and third NAND gates 40, 42 and 44, respectively, and a three input NAND gate 46. The outputs of the dual input NAND gates 40, 42 and 44 provide the three inputs to NAND gate 46, and the output of NAND gate 46 provides a second feedback signal $Y_2$. A NOT gate 48 provides the complement $\overline{Y}_2$. Signals $\overline{V}_O$ and $V_P$ provide the inputs to NAND gate 40, signals $V_P$ and $Y_2$ provide the inputs to NAND gate 42, and signals $\overline{V}_O$ and $Y_2$ provide the inputs to NAND gate 44. Thus, the second feedback signal $Y_2$ is determined by the logic equation:

$$Y_2 = \overline{(\overline{V_O V_P})(\overline{V_P Y_2})(\overline{V_O Y_2})}$$

The third logic circuit 28 includes first, second, third and fourth three-input NAND gates 50, 52, 54 and 56, respectively, first, second and third dual input NAND gates 58, 60 and 62, respectively, and first and second NOT gates 64 and 66, respectively. Inputs to NAND gate 50 are provided by signals $V_O$, $Y_1$, and $\overline{Y}_2$, and the inputs to NAND gate 52 are provided by signals $\overline{Y}_2$, $Y_1$ and $V_P$. The outputs of NAND gates 50 and 52 provide the inputs to NAND gate 58. The output of NAND gate 58 is inverted by NOT gate 64 and applied to one of the inputs to NAND gate 62.

Inputs to NAND gate 54 are provided by signals $\overline{V}_O$, $Y_2$ and $Y_1$, and inputs to NAND gate 56 are provided by signals $\overline{Y}_1$, $\overline{V}_P$ and $Y_2$. The outputs of NAND gates 54 and 56 provide the inputs to NAND gate 60. The output of NAND gate 60 is inverted by NOT gate 66 and applied to the other input of NAND gate 62.

The output of NAND gate 62, referenced Z, is the output signal of the comparator 10, with this input signal having a logic level indicative of the lead-lag relationship between the phasors being compared. Signal Z is determined by the following logic equation:

$$Z = \overline{(V_O \overline{Y}_1 \overline{Y}_2)(V_P \overline{Y}_2 Y_1)(\overline{V}_O Y_1 Y_2)(\overline{V}_P \overline{Y}_1 Y_2)}$$

Figure 4:
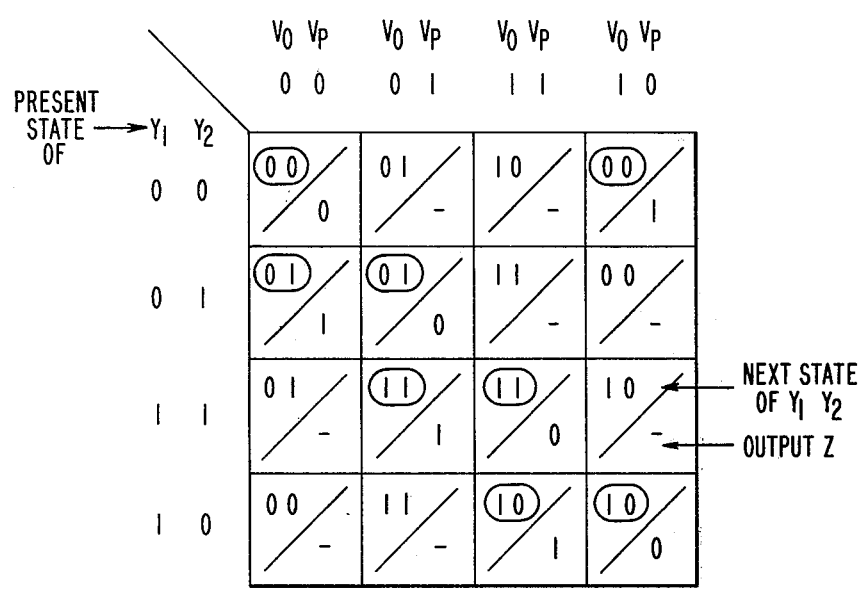
FIG. 4 is a transition table useful in understanding the operation of the detector shown in FIG. 1.

The stable and unstable states of comparator 10 are illustrated by the transition table shown in FIG. 4. The binary sequence of signals $V_O$ and $V_P$ is selected across the top of the table, above the four vertical columns, and the present state of the feedback signals $Y_1$ and $Y_2$ are selected across the lefthand side of the table, adjacent to the four horizontal rows. The box formed at the intersection of the pertinent column and row is then examined, with the next state of signals $Y_1Y_2$ being shown in the upper lefthand side of the box, and the logic output level Z of comparator 10 being shown in the lower righthand side of the box. If the next state listed for $Y_1Y_2$ is a stable state, it is indicated by a circle around the values for $Y_1Y_2$. If these values are not circled, it is not a stable state and, staying in the same vertical column, one advances to the horizontal row identified by the uncircled data. This new location should be a stable state indicated by a circle about the data, and the output indicated will be the output of the comparator 10.

For example, following the binary sequence for $V_OV_P$ shown in FIG. 2, if $V_OV_P$ are 00, assume $Y_1Y_2$ are 00, and the next state of $Y_1Y_2$ would be 00, which is circled a stable state. The output indicated is a logic zero. When $V_OV_P$ changes to 01, the next state listed for $Y_1Y_2$ is 01, which is uncircled, indicating an unstable state. Thus, move down to the second row in the same column which is identified by 01, and the next state will be 01 circled, a stable state, which produces the required logic zero output. If the next sequence for $V_OV_P$ is 11, an unstable state of 11 is indicated, requiring proceeding to the third row in the same column to find a stable state, which indicates the output is a logic zero.

Following the binary sequence for $V_OV_P$ shown in FIG. 3, if $V_OV_P$ are 00, assume $Y_1Y_2$ are 01, which produces a stable state indicating that the next state for $Y_1Y_2$ will be 01. When $V_OV_P$ changes to 10, an unstable state 00 is indicated. Proceeding to row 00 in this same column, a stable state of 00 is indicated, and the proper Z output of logic one is indicated. Going next to a $V_OV_P$ of 11 shows an unstable state of 10, and proceeding to the fourth row in this column, a stable state is indicated which produces the required logic one output.

If the binary sequence is that of FIG. 2 indicating that signal $V_P$ is leading signal $V_O$, detector 10 will output a logic zero, as just described. If the sequence should change to that of FIG. 3, indicating a change in the lead-lag relationship between the signals, the detector output will immediately change to a logic one, and it will remain at the logic one level as long as this new lead-lag relationship exists. For example, using the previous example for FIG. 2, the last step had a present state of 01 for $Y_1Y_2$ and $V_OV_P$ going to 11 which produced an indication of an unstable state at their intersection, and directed an advance to the third row in the same column which produced a logic zero output. If the sequence should now go to 01 for $V_OV_P$, with $Y_1Y_2$ still 11, of course, the interception finds a stable state with the output for detector 10 being a logic one instead of a logic zero, to indicate the new lead-lag relationship.

If the high threshold logic family (HTL) is used for the gates of comparator 10, there is no need to delay the feedback signals $Y_1Y_2$, as no race condition will result when using this type of logic. If a different logic family is used, delay circuits may be added to the outputs of the first and second logic means 24 and 26, to slightly delay signals $Y_1$ and $Y_2$ and thus prevent a race condition from developing.

Detector 10 should fail in the safe mode, in the event the polarizing signal $V_P$ is lost for some reason. This may be accomplished by dividing signal $V_P$ into two signals $V_{PP}$ and $V_{PN}$ via means 70, with signal $V_{PP}$ being a logic signal which is at the logic one level during the presence of the positive half cycle of $V_P$ and with signal $V_{PN}$ being a logic signal which is at the logic one level during the presence of the negative half cycles of signal $V_P$. For example, means 70 may include an operational amplifier to provide logic one signals during the negative half cycles of signal $V_P$.

Signals $V_{PP}$ and $V_{PN}$ are applied to a logic circuit 72 which includes NOT gates 74, 76 and 78 and dual input NAND gates 80 and 82. Signals $V_{PP}$ and $V_{PN}$ are input to NOT gates 74 and 76, respectively, and the outputs of gates 74 and 76 are applied to the inputs of NAND gate 80. As long as one of the signals $V_{PP}$ and $V_{PN}$ is a logic one, indicating presence of signal $V_P$, the output of NAND gate 80 will be a logic one. Should signal $V_P$ be lost, the output of NAND gate 80 will go low.

The output of NAND gate 80 provides one input to NAND gate 82, and signal Z from NAND gate 62 provides the other input. The output of NAND gate 82 is applied to NOT gate 78, and the output of NOT gate 78 provides the output of detector 10, referenced Z'. Signal Z' will follow signal Z as long as signal $V_P$ is present. Should signal $V_P$ be lost, gate 82 will be blocked by the low output of NAND gate 80, and signal Z' will be a logic zero regardless of the level of signal Z, which is the "safe" or non-operate condition.

In summary, there has been disclosed a new and improved digital phase sequence detector which is devoid of components sensitive to signal magnitudes for their operation. The disclosed detector requires no special circuits which must be made up of discrete components, enabling standard logic gates to be used which are readily available as i.c. packages. The detector provides the logic output level indicative of the present lead-lag relationship between two phases, with the logic level persisting as long as the indicated lead-lag relationship exists. Thus, the disclosed detector eliminates the need for pulse stretcher and/or timers on the output. A change in the lead-lag relationship is instantly detected and noted by a change in the output level of the detector, thus eliminating delays associated with certain prior art arrangements. Further, the disclosed phase sequence detector is asynchronous, having no flip-flops or other memory elements which require clock synchronization of the input signals.

I claim as my invention:

1. A digital phase sequence detector, constructed of standard logic gates devoid of memory elements, which detects phase sequence between first and second phasors, providing a change in its output as the first and second phasors exchange lead and lag positions, which change persists as long as the new relationship persists, comprising:

means providing a first phasor, means squaring the waveform of aid first phasor to provide a signal $V_P$, and its complement $\overline{V}_P$, means providing a second phasor, means squaring the waveform of said second phasor to provide a signal $V_O$, and its complement $\overline{V}_O$, first logic means providing a first feedback signal $Y_1$, and its complement $\overline{Y}_1$, second logic means providing a second feedback $Y_2$, and its complement $\overline{Y}_2$, said first logic means being responsive to signals $V_O$, $V_P$ and $Y_1$ such that the first feedback signal $Y_1$ is equal to $$\overline{(\overline{V_O V_P})(\overline{V_P Y_1})(\overline{V_O Y_1})},$$

said second logic means being responsive to signals $\overline{V}_O$, $V_P$ and $Y_2$ such that the second feedback signal $Y_2$ is equal to $$\overline{(\overline{\overline{V}_O V_P})(\overline{V_P Y_2})(\overline{\overline{V}_O Y_2})},$$

and third logic means providing an output signal having a first logic level when signal $V_O$ leads signal $V_P$ and a second logic level when signal $V_O$ lags signal $V_P$, said third logic means being responsive to signals $V_O$, $\overline{V}_O$, $V_P$, $\overline{V}_P$, $Y_1$, $\overline{Y}_1$, $Y_2$ and $\overline{Y}_2$, such that its output signal is equal to $$\overline{(\overline{V_O \overline{Y}_1 Y_2})(\overline{V_P Y_2 \overline{Y}_1})(\overline{V_O Y_1 \overline{Y}_2})(\overline{\overline{V}_P Y_1 Y_2})}.$$

2. The digital phase detector of claim 1, wherein the first, second and third logic means are constructed entirely of NAND and NOT gates.

3. The digital phase detector of claim 1 including fourth logic means responsive to the output signal of the third logic means and to signal $V_P$, with the output of said fourth logic means being responsive to the output signal of said third logic means as long as signal $V_P$ is present, and otherwise providing a signal having a predetermined logic level.

4. The digital phase detector of claim 3 including means responsive to signal $V_P$ providing a signal $V_{PP}$ in response to the positive half cycle of signal $V_P$ and a signal $V_{PN}$ responsive to the negative half cycle of signal $V_P$, with the forth logic means being responsive to both signals $V_{PP}$ and $V_{PN}$, providing a signal having the predetermined logic level in response to the loss of either signal $V_{PP}$ or $V_{PN}$.

* * * * *